United States Patent
Hong et al.

(10) Patent No.: US 12,322,346 B2
(45) Date of Patent: Jun. 3, 2025

(54) DISPLAY DEVICE

(71) Applicant: Samsung Display Co., LTD., Yongin-si (KR)

(72) Inventors: Sung Jin Hong, Seoul (KR); Sun Ho Kim, Seongnam-si (KR); Hye Won Kim, Seoul (KR); Ju Chan Park, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/680,567

(22) Filed: May 31, 2024

(65) Prior Publication Data

US 2024/0321219 A1    Sep. 26, 2024

Related U.S. Application Data

(63) Continuation of application No. 18/198,811, filed on May 17, 2023, now Pat. No. 12,033,584, which is a
(Continued)

(30) Foreign Application Priority Data

Nov. 20, 2020    (KR) .................... 10-2020-0156763

(51) Int. Cl.
   *G09G 3/3266*    (2016.01)
   *H10K 59/121*    (2023.01)
   *H10K 59/131*    (2023.01)

(52) U.S. Cl.
   CPC ......... *G09G 3/3266* (2013.01); *H10K 59/121* (2023.02); *H10K 59/131* (2023.02)

(58) Field of Classification Search
   CPC ... G09G 3/3266; H10K 59/131; H10K 59/121
   See application file for complete search history.

(56) References Cited

U.S. PATENT DOCUMENTS

| 10,475,406 B2 | 11/2019 | Kim et al. |
| 2014/0300649 A1* | 10/2014 | Park ..................... G09G 3/3208 345/690 |

(Continued)

FOREIGN PATENT DOCUMENTS

| CN | 108389881 | 8/2018 |
| CN | 110767159 | 2/2020 |

(Continued)

OTHER PUBLICATIONS

Notice of Allowance issued Feb. 15, 2023, in U.S. Appl. No. 17/344,851.

*Primary Examiner* — Robert J Michaud
(74) *Attorney, Agent, or Firm* — KILE PARK REED & HOUTTEMAN PLLC

(57) ABSTRACT

A display device includes: a substrate having a first display area, a second display area, and a non-display area; a first circuit disposed on the substrate; a first light emitter electrically connected to the first circuit and which overlaps the first display area; a second circuit disposed on the substrate; a second light emitter electrically connected to the second circuit and which overlaps the second display area; and a scan driver positioned on the substrate and which overlaps at least a portion of the second display area and the non-display area.

33 Claims, 11 Drawing Sheets

Related U.S. Application Data continuation of application No. 17/344,851, filed on Jun. 10, 2021, now Pat. No. 11,694,625.

(56) References Cited

U.S. PATENT DOCUMENTS

| | | | |
|---|---|---|---|
| 2019/0392767 A1* | 12/2019 | Kim | H10K 59/131 |
| 2021/0036090 A1 | 2/2021 | Hong et al. | |
| 2022/0189410 A1 | 6/2022 | Kim et al. | |

FOREIGN PATENT DOCUMENTS

| KR | 10-2018-0128614 | 12/2018 |
|---|---|---|
| KR | 10-2020-0015870 | 2/2020 |

* cited by examiner

DISPLAY DEVICE

CROSS-REFERENCE TO RELATED APPLICATION

This is a continuation application of U.S. patent application Ser. No. 18/198,811 filed May 17, 2023 (now pending), the disclosure of which is incorporated herein by reference in its entirety. U.S. patent application Ser. No. 18/198,811 is a continuation application of U.S. patent application Ser. No. 17/344,851 filed Jun. 10, 2021, now U.S. Pat. No. 11,694,625, issued Jul. 4, 2023, the disclosure of which is incorporated herein by reference in its entirety. U.S. patent application Ser. No. 17/344,851 claims priority to and benefits of Korean Patent Application No. 10-2020-0156763 under 35 U.S.C. § 119, filed Nov. 20, 2020 in the Korean Intellectual Property Office, the entire contents of which are incorporated herein by reference.

BACKGROUND

Field

Embodiments of the invention relate generally to display devices and, more particularly, to a display device having an extended display area.

Discussion of the Background

A display device is a device that visually displays data. Such a display device includes a substrate that is partitioned into a display area and a non-display area. In the display area, a scan line and a data line are disposed therein while being insulated from each other, and a plurality of pixels are also included in the display area. In addition, a thin film transistor and a pixel electrode that is electrically connected to the thin film transistor are disposed in the display area to correspond to each of the pixels. In the display area, an opposite electrode commonly provided to the pixels may be provided. In the non-display area, various wires that transfer electrical signals to the display area, as well as a scan driver, a data driver, a controller, and the like may be provided.

Such a display device has various uses. Accordingly, designs for the peripheral area of a display device are diversifying to suit various different needs.

The above information disclosed in this Background section is only for understanding of the background of the inventive concepts, and, therefore, it may contain information that does not constitute prior art.

SUMMARY

Display devices constructed according to the principles and illustrative embodiments of the invention have first and second display areas such that an image displayed on the first and second display areas appears as if it is displayed on a single display region and not on two separate displays.

Display devices constructed according to the principles and one of more embodiments of the invention have a display with an extended region.

In display devices constructed according to the principles and one of more embodiments of the invention a boundary between the first and second display areas is not visually recognized by a user.

Display devices constructed according to the principles and one of more embodiments of the invention have electrical components, such as scan drivers, driving circuits, light emitting elements and the like, which may be disposed in particularly compact overlapping configurations to maximize the display areas and minimize the non-display areas.

Additional features of the inventive concepts will be set forth in the description which follows, and in part will be apparent from the description, or may be learned by practice of the inventive concepts.

According to one embodiment, a display device includes: a substrate having a first display area, a second display area, and a non-display area; a first circuit disposed on the substrate; a first light emitter electrically connected to the first circuit and which overlaps the first display area; a second circuit disposed on the substrate; a second light emitter electrically connected to the second circuit and which overlaps the second display area; and a scan driver disposed on the substrate and which overlaps at least a portion of the second display area and the non-display area.

The second display area may be positioned between the first display area and the non-display area.

The second light emitter may overlap at least a portion of the second circuit and the scan driver.

The display device may include: a first scan line set electrically connected to the first circuit positioned in an $n^{th}$ row, n being a positive integer greater than or equal to 1; and a second scan line set electrically connected to the first circuit positioned in an $(n+1)^{th}$ row, and the first scan line set may be electrically connected to the second circuit positioned in the $n^{th}$ row in the second display area, while the second scan line set may cross the second display area to be connected to the scan driver.

The display device may further include: a third scan line set electrically connected to the first circuit positioned in an $(n+2)^{th}$ row; and a fourth scan line set electrically connected to the first circuit positioned in an $(n+3)^{th}$ row, and the third scan line set may be electrically connected to the second circuit positioned in the $(n+1)^{th}$ row in the second display area, while the fourth scan line set may cross the second display area to be connected to the scan driver.

In the second display area, the scan line set positioned in the $n^{th}$ row and the scan line set positioned in the $(n+1)^{th}$ row may constitute a first repeating unit.

The display device may include: a third scan line set electrically connected to the first circuit positioned in an $(n+2)^{th}$ row; and a fourth scan line set electrically connected to the first circuit positioned in an $(n+3)^{th}$ row, and the third scan line set may cross the second display area to be connected to the scan driver, while the fourth scan line set may be electrically connected to the second circuit positioned in the $(n+1)^{th}$ row in the second display area.

In the second display area, the first scan line set or the fourth scan line set may constitute a second repeating unit, and the second repeating unit may be repeatedly disposed.

The display area may include: a first portion of the first display area in which a boundary between the first display area and the second display area is a straight line; and a second portion of the first display area that is separate than the first portion of the first display area.

In the second portion of the first display area, a boundary between the first display area and the second display area may have a round shape.

In the second portion of the first display area, a boundary between the first display area and the second display area may have a step shape.

The second repeating unit may be disposed in the first portion of the first display area, and the first repeating unit may be disposed in the second portion of the first display area.

The first repeating unit may be disposed in the first portion of the first display area and the second portion of the first display area.

According to another embodiment, a display device includes: a substrate; a first circuit disposed on the substrate; a first light emitter electrically connected to the first circuit; a second circuit disposed on the substrate; a second light emitter electrically connected to the second circuit; and a scan driver positioned on the substrate, wherein the first circuit, the second circuit, and the scan driver are disposed with respect to an edge of the substrate such that the scan driver is farthest from the edge of the substrate, the first circuit is closest to the edge of the substrate, and the second circuit is between the first circuit and the scan driver, the second light emitter overlaps at least a portion of the second circuit and the scan driver, and the second circuit is connected to any one of an $n^{th}$ scan line set and an $(n+2)^{th}$ scan line set extending from the first circuit, n being a positive integer greater than or equal to 1.

The $(n+1)^{th}$ scan line set and the $(n+3)^{th}$ scan line set extending from the first circuit may be connected to the scan driver.

The $(n+1)^{th}$ scan line set and the $(n+3)^{th}$ scan line set may not be connected to the second circuit.

In the second display area, the $n^{th}$ scan line set and the $(n+1)^{th}$ scan line set may be disposed as one repeating unit.

The second light emitter may include at least one second light emitting element, the first light emitter may include at least one first light emitting element, and an area occupied by the second light emitting element may be larger than an area occupied by the first light emitting element.

The second circuit may include a second driving circuit, the first circuit may include a first driving circuit, and an area occupied by the second driving circuit may be larger than an area occupied by the first driving circuit.

The display device may include: a first display area configured to overlap the first light emitter; a second display area configured to overlap the second light emitter; and a non-display area positioned outside the second display area.

According to the embodiments, it is possible to provide a display device having a display area that is of an extended size. According to the embodiments, it is possible to provide a display device in which a boundary between the extended-size display area and an existing display area is not visually recognized.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
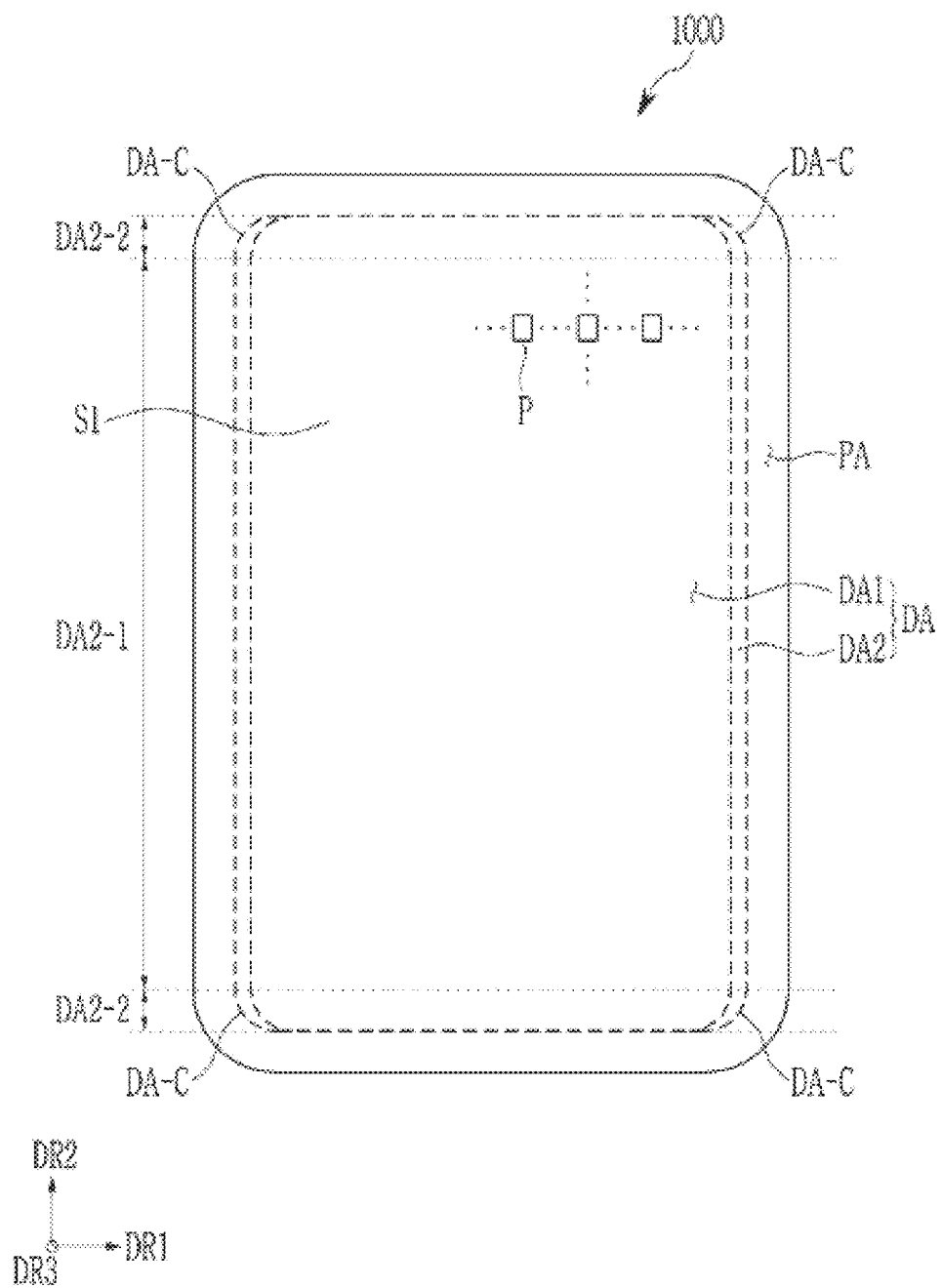
FIG. 1 illustrates a schematic top plan view of an embodiment of a display device constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein. Unless otherwise noted, "overlap" as referred to hereinbelow refers to the z-axis direction (e.g., DR3 direction) of an x-y-z three axis coordinate system (e.g., a DR1/DR2/DR3 coordinate system as shown in the drawings).

Figure 2:
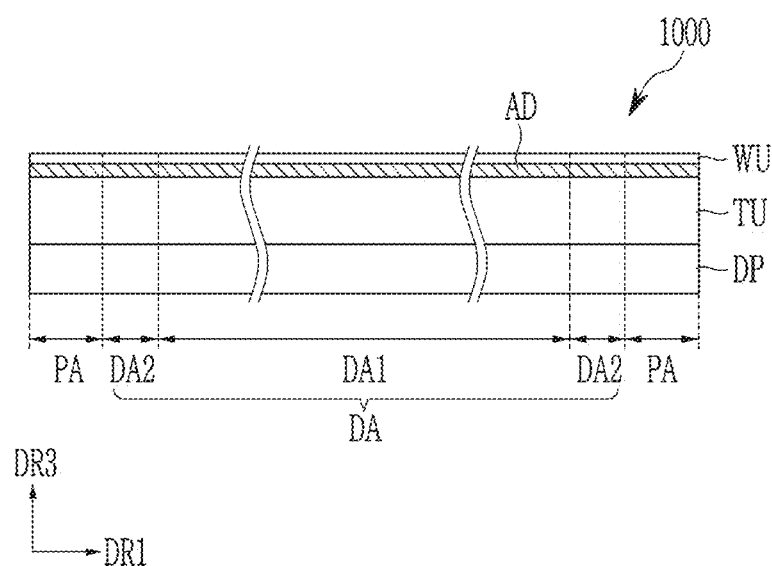
FIG. 2 illustrates a schematic cross-sectional view of the display device of FIG. 1.

FIG. 1 illustrates a schematic top plan view of an embodiment of a display device constructed according to principles of the invention, and FIG. 2 illustrates a schematic cross-sectional view of a display device of FIG. 1.

Referring to FIG. 1, a display device 1000 according to an embodiment includes a display area DA in which a plurality of pixels P are disposed to display an image, and a non-display area PA that is adjacent to the display area DA. The non-display area PA is an area in which an image is not displayed.

The display area DA may have a generally rectangular shape, for example. Each edge DA-C of the display area DA may have a rounded shape. The non-display area PA may completely surround the display area DA. However, the embodiments are not limited thereto, and shapes of the display area DA and the non-display area PA may take various forms depending upon the particular application.

The display area DA may include a first display area DA1 and a second display area DA2 positioned between the first display area DA and the non-display area PA. The second display area DA2 may generally extend along a second direction DR2 (i.e., y-direction of a mutually orthogonal x-y-z three-axis coordinate system), but the embodiments are not limited thereto. The second display area DA2 may be an area including the rounded edges DA-C of the display area DA.

The display device 1000 includes a first portion of the second display area DA2-1 and a second portion of the second display area DA2-2 that is divided depending on the second direction DR2 that is orthogonal to the first direction DR1 (i.e., x and y axes). The display area DA may include two second portions of second display areas DA2-2 including the rounded edges DA-C and a first portion of the second display area DA2-1 positioned between two second portions of the second display areas DA2-2. In the second portion of the second display area DA2-2, a boundary between the first display area DA1 and the second display area DA2 may have a round shape. Further, the pixels P disposed between the first and second display areas DA1 and DA2 may be arranged in a stepped shape (e.g., a shape resembling a staircase).

In the display device 1000, a first surface S1 on which an image is displayed is substantially parallel to a surface defined by a first direction DR1 and the second direction DR2 (i.e., an x direction and a y direction). A direction normal to the surface on which an image is displayed, i.e., the thickness direction of the display device 1000, is represented as a third direction DR3 (i.e., a z direction of the x-y-z coordinate system). A front (or top) surface and a back (or bottom) surface of each of the members are separated in the third direction DR3. However, the directions indicated by the first to third directions DR1, DR2, and DR3 may be converted to other directions.

Referring to FIG. 2 as well as FIG. 1 described above, the display device 1000 may include a display panel DP, a touch unit TU positioned on the display panel DP, and a cover window WU positioned on the touch unit TU.

The display panel DP may be a flat rigid display panel, but the embodiments are not limited thereto, and may be a flexible display panel. The display panel may be an emissive display panel, but the embodiments are not particularly limited thereto. For example, the display panel may be an organic light emitting display panel or a quantum dot light emitting display panel. An emission layer of the organic light emitting display panel may include an organic light emitting material. An emission layer of the quantum dot light emitting display panel may include a quantum dot and a quantum rod. Hereinafter, the display panel will be described as an organic light emitting display panel for descriptive convenience.

A touch unit TU may be disposed on the display panel DP for a touch screen function of the display device 1000. The touch unit TU may include touch electrodes of various patterns, and may be a resistive type or a capacitive type.

A cover window WU is positioned on the display panel DP and the touch unit TU. The cover window WU protects the display panel DP and the touch unit TU. The cover window WU may define an appearance of the display device.

An adhesive layer AD may be disposed between the touch unit TU and the cover window WU. An adhesive layer disposed between the display panel DP and the touch unit TU may be further included in alternative implementations of the embodiment shown in FIG. 2.

Figure 3:
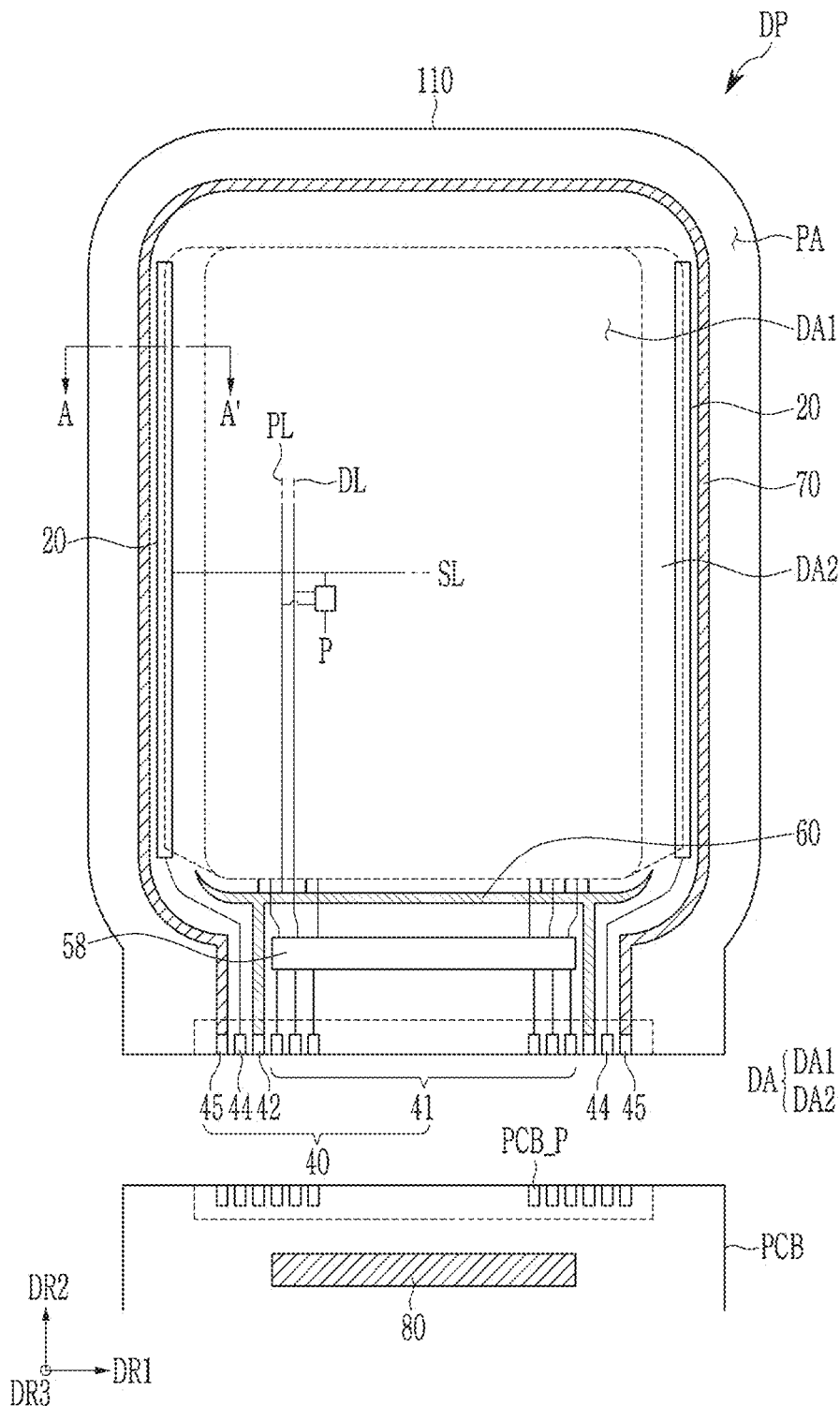
FIG. 3 illustrates a top plan view of an embodiment of the display panel of FIG. 2 showing constituent elements positioned in a non-display area.
Figure 4:
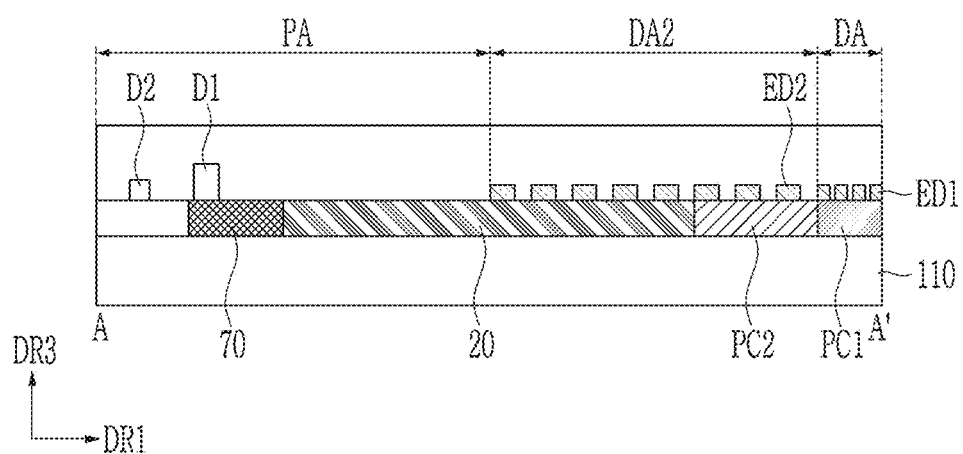
FIG. 4 illustrates a schematic cross-sectional view taken along a line A-A' of FIG. 3.
Figure 5:
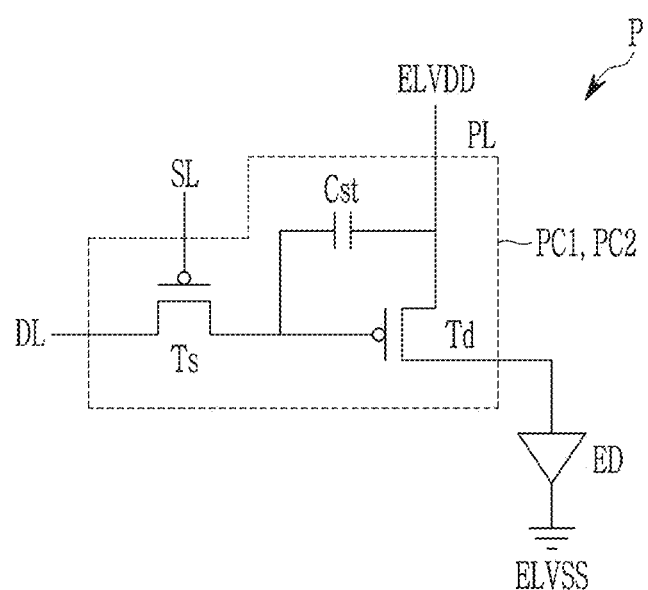
FIG. 5 illustrates a schematic block diagram of an embodiment of an equivalent circuit diagram of a representative pixel of the display panel of FIG. 3.
Figure 6:
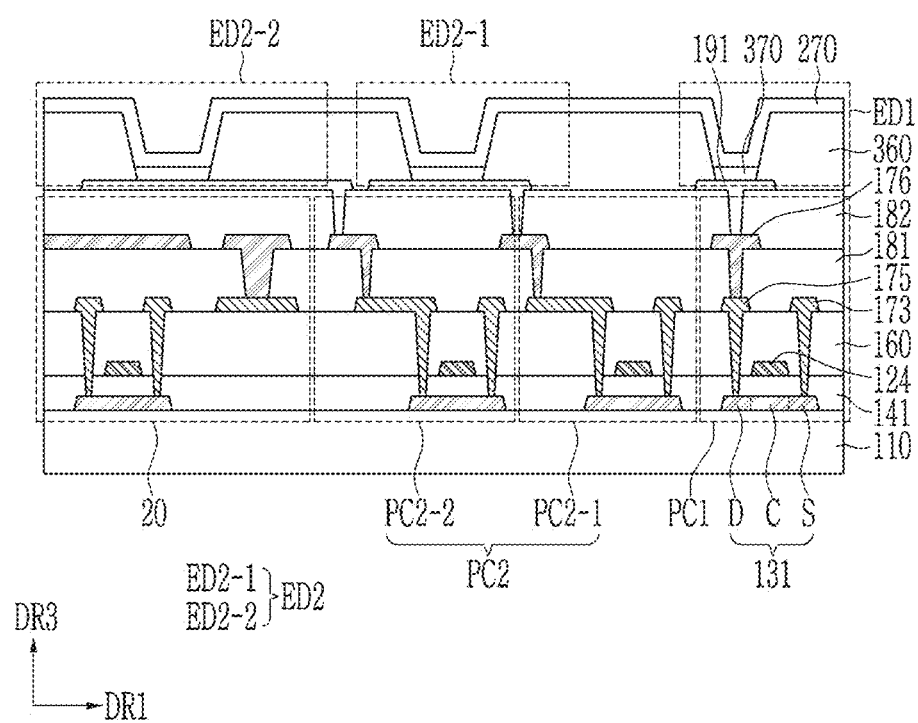
FIG. 6 illustrates a cross-sectional view of an embodiment of a region of the display panel of FIG. 3.

FIG. 3 illustrates a top plan view of an embodiment of the display panel of FIG. 2 showing constituent elements positioned in a non-display area, FIG. 4 illustrates a schematic cross-sectional view taken along a line A-A' of FIG. 3, FIG. 5 illustrates a schematic block diagram of a embodiment of an equivalent circuit diagram of a representative pixel of the display panel of FIG. 3, and FIG. 6 illustrates a cross-sectional view of an embodiment of a region of a display panel of FIG. 3.

Referring to FIG. 3, the display panel DP includes a display area DA and a non-display area PA corresponding to the display area DA and the non-display area PA of the display device 1000 described in FIG. 1. The non-display area PA may be defined along an edge of the display area DA.

The display panel DP includes a plurality of pixels P. The pixels P may be disposed in the display area DA on the substrate 110. Each of the pixels P includes a light emitter, which may be in the form of a light emitting element and a driving circuit connected thereto.

Each of the pixels P emits, e.g., red, green, blue, or white light, and may include, e.g., an organic light emitting diode. The display panel DP provides a predetermined image through light emitted from the pixels P, and the display area DA is defined by the pixels P. As used herein, the non-display area PA indicates an area that does not provide an image, and in which the light emitting element is not disposed.

The display panel DP may include a plurality of signal lines and a pad portion. The signal lines may include a scan line SL extending in a first direction DR1, and a data line DL and a driving voltage line PL extending in a second direction DR2.

The scan driver 20 is positioned across the display area DA and the non-display area PA on the substrate 110. Specifically, the scan driver 20 is positioned to overlap at least a portion of the second display area DA2 and at least a portion of the non-display area PA in the thickness direction z.

The scan driver 20 generates and transfers a scan signal to each pixel P through the scan line SL. According to an embodiment, the scan driver 20 may be disposed at left and right sides of the display area DA. Although the embodiment described herein shows a structure in which scan drivers 20 are disposed at opposite sides of the substrate 110, the scan driver may be disposed only at a side of the substrate 110.

The pad portion 40 is disposed at a first end of the display panel DP, and includes a plurality of terminals 41, 42, 44, and 45. The pad portion 40 may be exposed without being covered by an insulating layer to be electrically connected to a printed circuit board PCB. The pad portion 40 may be electrically connected to a pad portion PCB_P of the printed circuit board PCB. The printed circuit board PCB may transfer a signal or power of an IC driving chip 80 to the pad portion 40.

The controller varies a plurality of image signals transferred from the outside into a plurality of image data signals, and transmits the varied signals to the data driver 58 through the terminal 41. In addition, the controller may receive a vertical synchronization signal, a horizontal synchronizing signal, and a clock signal, generate control signals for controlling driving of the scan driver 20 and the data driver 58, and transfer them thereto through the terminals 44 and 41. The controller transfers the driving voltage ELVDD to a driving voltage supply line 60 through the terminal 42. In addition, the controller transfers a common voltage ELVSS to each common voltage supply line 70 through the terminal 45.

The data driver 58 is disposed on the non-display area PA, and generates and transfers a data signal to each pixel P through the data line DL. The data driver 58 may be disposed at a side of the display panel DP, for example, it may be disposed between the pad portion 40 and the display area DA.

A driving voltage supply line 60 is positioned on the non-display area PA. For example, the driving voltage supply line 60 may be positioned between the data driver 58 and the display area DA. The driving voltage supply line 60 provides the driving voltage ELVDD to the pixels P. The driving voltage supply line 60 is positioned in the first direction DR1, and may be connected to a plurality of driving voltage lines PL positioned in the second direction DR2.

A common voltage supply line 70 is positioned on the non-display area PA. The common voltage supply line 70 may have a shape surrounding the substrate 110. The common voltage supply line 70 transfers the common voltage ELVSS to one electrode (e.g., a common electrode) of a light emitting element included in the pixel P.

The display area DA according to an embodiment includes a first display area DA1 and a second display area DA2. The non-display area PA is disposed in an outer area relative to the first display area DA1 and the second display area DA2.

The second display area DA2 may overlap in the z-axis direction at least a portion of the scan driver 20. The display area DA is an area where the light emitting elements are positioned to emit light. A scan driver may be positioned at a lower portion of the light emitting element. This will be described with reference to FIG. 4 and FIG. 6.

First, referring to FIG. 4, a first driving circuit PC1, a second driving circuit PC2, a scan driver 20, and a common voltage supply line 70 may be positioned on a substrate 110. The second driving circuit PC2, the scan driver 20, and the common voltage supply line 70 may be positioned adjacent to the first driving circuit PC1 in this order. Dams D1 and D2 may be positioned in the non-display area PA.

Referring to FIG. 5, representative pixel P includes the driving circuits PC1 and PC2, which may be formed as separate units, and a light emitting diode ED that is electrically connected thereto. Each of the first driving circuit PC1 and the second driving circuit PC2 includes a driving thin film transistor Td, a switching thin film transistor Ts, and a storage capacitor Cst.

The switching thin film transistor Ts is connected to a scan line SL and a data line DL, and transfers a data signal input through the data line DL to the driving thin film transistor Td depending on a scan signal that is inputted through the scan line SL.

The storage capacitor Cst is connected to the switching thin film transistor Ts and the driving voltage line PL, and a voltage corresponding to a difference between a voltage transferred from the switching thin film transistor Ts and the driving voltage ELVDD supplied to the driving voltage line PL is stored.

The driving thin film transistor Td is connected to the driving voltage line PL and the storage capacitor Cst, and a driving current flowing from the driving voltage line PL to the light emitting diode ED may be controlled in response to a voltage value stored in the storage capacitor Cst. The light emitting diode ED may emit light having predetermined luminance by a driving current.

Referring back to FIG. 4, the first driving circuit PC1 overlaps the first display area DAL. The second driving circuit PC2 overlaps the second display area DA2. The scan driver 20 overlaps the second display area DA2 and the non-display area PA. The common voltage supply line 70 overlaps the non-display area PA.

The first driving circuit PC1 is electrically connected to a first light emitting diode ED1 disposed above the first driving circuit PC1. An area in which light is emitted by the first light emitting diode ED1 is the first display area DA1. The first driving circuit PC1 and the first light emitting diode ED1 may be positioned in the first display area DAL.

The second driving circuit PC2 is electrically connected to the second light emitting diode ED2. An area in which light is emitted by the second light emitting diode ED2 is the second display area DA2. A portion of the second light emitting diode ED2 positioned on the second driving circuit PC2 and a portion of the second light emitting diode ED2 positioned on the scan driver 20 may be positioned in the second display area DA2.

That is, for the driving circuits PC1 and PC2, the scan driver 20, and the common voltage supply line 70 positioned between one surface of the light emitting diode ED2 and the substrate 110, even when the light emitting diode ED2 is positioned in an area overlapping the scan driver 20, the second display area DA2 having an extended area may be provided by including the light emitting diode ED2 positioned on the scan driver 20. The display device may provide a display area that is extended from the first display area DA1 to the second display area DA2.

A more specific example of stacked structure will be described with reference to FIG. 6 as well as the above-described drawings. First, the first driving circuit PC1 and the first light emitting diode ED1 positioned in the first display area DA1 will be described.

The first driving circuit PC1 includes a semiconductor layer 131 disposed on a substrate 110.

The substrate 110 may include a material such as glass, metal, or an organic substance containing SiO2 as a main component. According to an embodiment, the substrate 110 may include a flexible material. For example, the substrate 110 may include a flexible plastic material such as polyimide, but the embodiments are not limited thereto. According to another embodiment, the plastic material may be polyethersulfone (PES), polyacrylate (PAR), polyether imide (PEI), polyethylene naphthalate (PEN), polyethylene terephthalate (PET), polyphenylene sulfide (PPS), polyarylate, polyimide, polycarbonate (PC), cellulose triacetate (TAC), cellulose acetate propionate (CAP), cyclic olefin polymer, cyclic olefin copolymer, or the like.

The semiconductor layer 131 may include at least one of polysilicon and an oxide semiconductor. The semiconductor layer 131 includes a channel region C, a source region S, and a drain region D. The source region S and the drain region D are positioned at opposite sides of the channel region C, respectively. The channel region C may include an intrinsic semiconductor that is not doped with an impurity, and the source region S and the drain region D may include an impurity semiconductor doped with a conductive impurity. The semiconductor layer 131 may be formed by using an oxide semiconductor, and in this case, a separate protective layer (not illustrated) may be added to protect an oxide semiconductor material that is vulnerable to external environments such as a high temperature.

A gate insulating layer 141 is disposed on the semiconductor layer 131. The gate insulating layer 141 may be a single layer or multiple layers including at least one of a silicon nitride (SiNx) and a silicon oxide (SiO2). In the illustrated embodiment, the gate insulating layer 141 is formed over substantially the entire surface of the substrate 110, but the embodiments are not limited thereto, and gate insulating layer 141 may be provided in a form overlapping only in the channel region C.

A gate electrode 124 is positioned on the gate insulating layer 141 overlapping the channel region (C). The gate electrode 124 may be a single layer or a multilayer in which a metal film including any one of copper (Cu), a copper alloy, aluminum (Al), an aluminum alloy, molybdenum (Mo), and a molybdenum alloy is stacked.

An interlayer insulating layer 160 is disposed on the gate electrode 124 and the gate insulating layer 141. The interlayer insulating layer 160 may include an inorganic material including a silicon oxide (SiOx), a silicon nitride (SiNx), and a silicon nitride oxide (SiOxNy), or may include an organic material. The interlayer insulating layer 160 may have a single layer structure or a multilayer structure.

The source electrode 173 and the drain electrode 175 may be disposed on the interlayer insulating layer 160. The source electrode 173 and the drain electrode 175 are respectively connected to the source region S and the drain region D of the semiconductor layer 131 through contact holes formed in the interlayer insulating layer 160.

The source electrode 173 and the drain electrode 175 may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), tantalum (Ta), titanium (Ti), tungsten (W), copper (Cu), and/or the like, and may have a single layer structure or a multilayer structure including the material. For example, the source electrode 173 and the drain electrode 175 may have a triple-layer structure of a lower film containing a refractory metal such as molybdenum, chromium, tantalum, or titanium, or an alloy thereof, an intermediate film containing an aluminum-based metal, a silver-based metal, or a copper-based metal having low resistivity, and an upper film containing a refractory metal such as molybdenum, chromium, tantalum, or titanium.

A first insulating layer 181 is disposed on the source electrode 173 and the drain electrode 175. The first insulating layer 181 may be disposed to overlap a front surface the substrate 110. The first insulating layer 181 is made of a silicon nitride (SiNx), a silicon oxide (SiOx), or the like, or an organic material.

A connection electrode 176 is disposed on the first insulating layer 181. The connection electrode may be connected to the drain electrode 175 through a contact hole formed in the first insulating layer 181. Although the illustrated embodiment shows a configuration in which the drain electrode 175 and the pixel electrode 191 are electrically connected by the connection electrode 176, the embodiments are not limited thereto, and the drain electrode 175 and the pixel electrode 191 may be directly connected.

A second insulating layer 182 is disposed on the connection electrode 176. The second insulating layer 182 may be made of an organic material, a stacked film of an organic material and an inorganic material, or an inorganic film, including a general purpose polymer such as poly(methyl methacrylate) (PMMA) or polystyrene (PS), a polymer derivative having a phenolic group, an organic insulating material such as an acrylic polymer, an imide polymer, a polyimide, an acrylic polymer, a siloxane polymer, etc.

A pixel electrode 191 is positioned on the second insulating layer 182. The pixel electrode 191 is connected to the connection electrode 176 through a contact hole of the second insulating layer 182, and is electrically connected to the drain electrode 175.

The thin film transistor formed to include the gate electrode 124, the semiconductor layer 131, the source electrode 173, and the drain electrode 175 is connected to the pixel electrode 191 to supply a current to a light emitting diode ED1.

A partition wall 360 is positioned on the second insulating layer 182 and the pixel electrode 191. The partition wall 360 overlaps at least a portion of the pixel electrode 191, and has an opening defining a light emitting region. The opening may have a generally planar shape that is substantially similar to that of the pixel electrode 191. The opening may have a generally rhomboidal or an octagonal shape that is similar to a rhombus in a plan view, but the embodiments are not limited thereto, and may have any shape such as a square or a polygon.

The partition wall 360 may include an organic material including a general purpose polymer such as poly(methyl methacrylate) (PMMA) or polystyrene (PS), a polymer derivative having a phenolic group, an organic insulating material such as an acrylic polymer, an imide polymer, a polyimide, an acrylic polymer, a siloxane polymer, etc, or a silica-based inorganic material.

An emission layer 370 is disposed on the pixel electrode 191 overlapping the opening. The emission layer 370 may be formed to include a low molecular organic material or a polymer organic material such as poly(3,4-ethylenedioxythiophene) (PEDOT). In addition, the emission layer 370 may be a multilayer further including at least one of a hole injection layer (HIL), a hole transporting layer (HTL), an electron transporting layer (ETL), and an electron injection layer (EIL).

Most of the emission layer 370 may be positioned within the opening, and may also be positioned on a side surface of the partition wall 360 or on the partition wall 261.

A common electrode 270 may be disposed on the emission layer 370. The common electrode 270 may include a reflective metal including calcium (Ca), barium (Ba), magnesium (Mg), aluminum (Al), silver (Ag), platinum (Pt), palladium (Pd), gold (Au), nickel (Ni), neodymium (Nd), Iridium (Ir), chromium (Cr), lithium (Li), calcium (Ca), etc., or a transparent conductive oxide (TCO) such as indium tin oxide (ITO) or indium zinc oxide (IZO).

The pixel electrode 191, the emission layer 370, and the common electrode 270 may constitute the first light emitting diode ED1. Herein, the pixel electrode 191 may be an anode which is a hole injection electrode, and the common electrode 270 may be a cathode which is an electron injection electrode. However, the embodiments are not limited thereto, and the pixel electrode 191 may be a cathode and the common electrode 270 may be an anode depending on a driving method of an emissive display device.

When holes and electrons are injected from the pixel electrode 191 and the common electrode 270 into the emission layer 370, excitons formed by combining the injected holes and electrons are emitted when they fall from an excited state to a ground state.

Components positioned between the substrate 110 and the light emitting diode ED1 in FIG. 6 correspond to the first driving circuit PC1 described in FIG. 4. The first driving circuit PC1 may be connected to the first light emitting diode ED1 positioned on the first driving circuit PC1.

The second driving circuit PC2 may be positioned outside the first driving circuit PC1. Since a stacked structure of the second driving circuit PC2 may be substantially the same as the stacked structure of the first driving circuit PC1, a detailed description thereof will be omitted to avoid redundancy.

The pixel electrode 191 included in the second driving circuit PC2 may extend toward an edge of the substrate 110. The pixel electrode 191 included in a second light emitting diode ED2 may be disposed toward an edge of the substrate 110 compared to the second driving circuit PC2 connected to a second light emitting diode ED2 while being disposed outwardly along the first direction DR1. That is, the second light emitting diode ED2 may be positioned outside along the first direction DR1 compared to the driving circuit PC2 connected to each second light emitting diode ED2.

Specifically, a first part of the second light emitting diode ED2-1 is electrically connected to a first part of the second driving circuit PC2-1. In this case, the first part of the second driving circuit PC2-1 is positioned adjacent to the first driving circuit PC1. On the other hand, the first part of the second light emitting diode ED2 connected to the first part of the second driving circuit PC2-1 may be positioned to be inclined toward the edge of the substrate 110 along the first direction DR1. The first part of the second light emitting diode ED2 may be positioned adjacent to the edge of the substrate 110 compared to the first part of the second driving circuit PC2-1.

In addition, a second part of the second driving circuit PC2-2 may be electrically connected to a second part of the second light emitting diode ED2-2. The second part of the second driving circuit PC2-2 may be positioned adjacent to the first part of the second driving circuit PC2-1. The pixel electrode 191 of the second part of the second light emitting diode ED2 connected to the second part of the second driving circuit PC2-2 may extend toward the edge of the substrate 110 to overlap the scan driver 20. The second part of the second light emitting diode ED2-2 may be positioned adjacent to the edge of the substrate 110 compared to the second part of the second driving circuit PC2-2. The scan driver 20 may be positioned at a lower end of the second part of the second light emitting element ED2-2, instead of the second part of the second driving circuit PC2-2.

An area where the first light emitting diode ED1 is positioned is the first display area DA1 based on the layer on which the light emitting diode is positioned. In addition, an area where the second light emitting diode ED2 is positioned is the second display area DA2 based on the layer on which the light emitting diode is positioned. In this case, while the second display area DA2 emits light, a driving circuit such as the scan driver 20 may be positioned at a lower portion of the light emitting diode ED2. As the display area DA includes not only the first display area DA1 but also the second display area DA, an extended display area may be provided.

Figure 7:
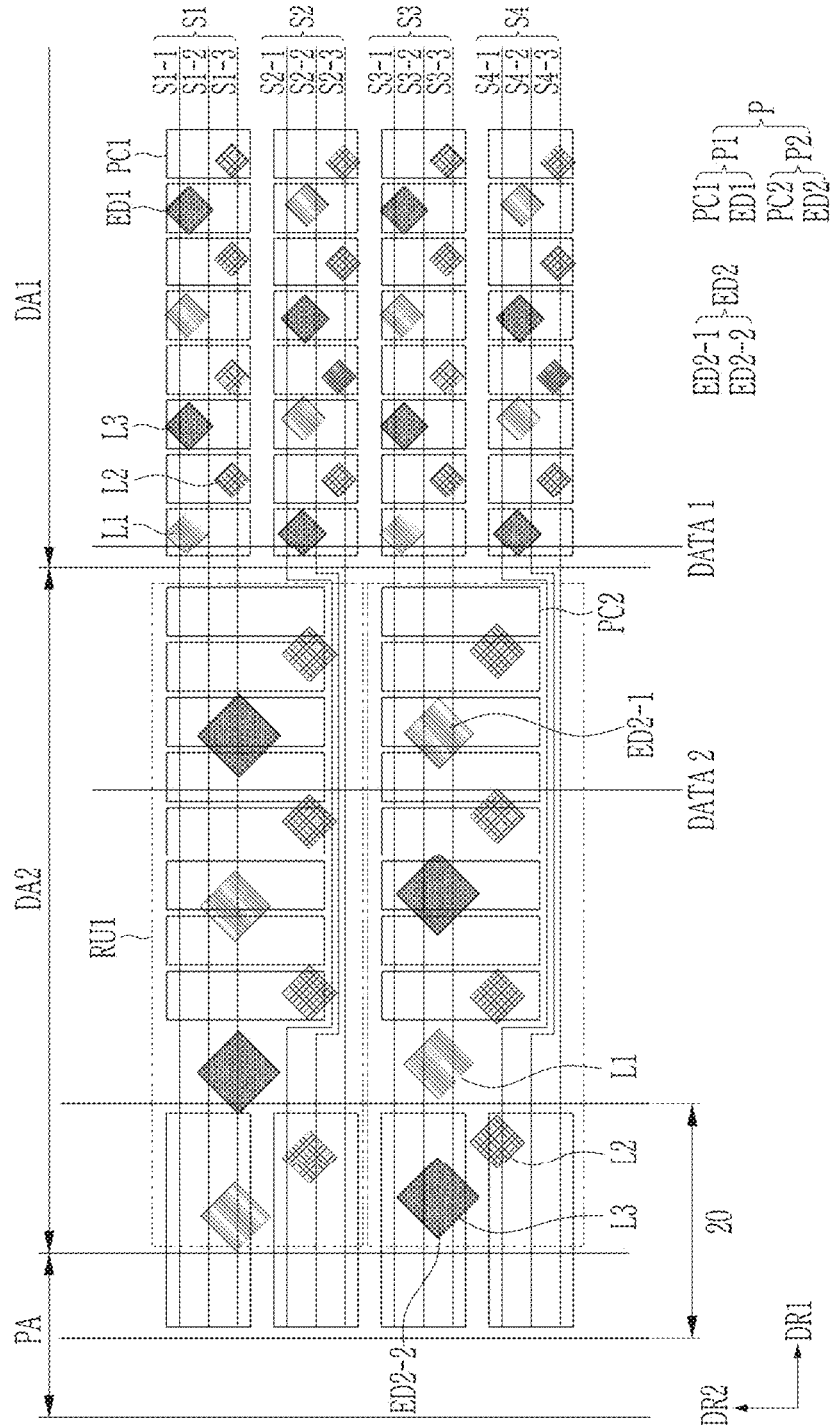
FIG. 7 illustrates a schematic top plan view of an embodiment of a connection between a driving circuit and a light emitting diode of a representative pixel.
Figure 8:
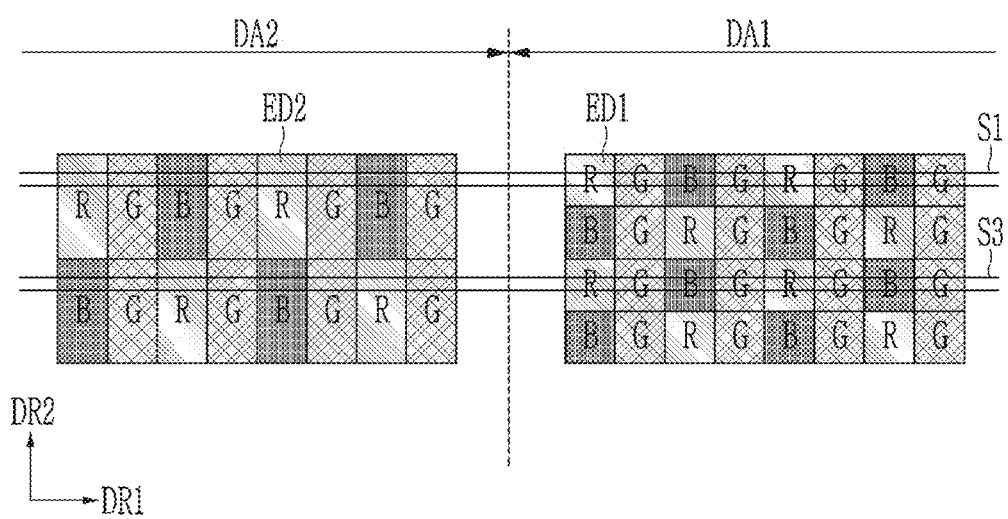
FIG. 8 illustrates a schematic diagram of light emitted from each display area of an embodiment of an extended display device constructed according to principles of the invention.
Figure 9:
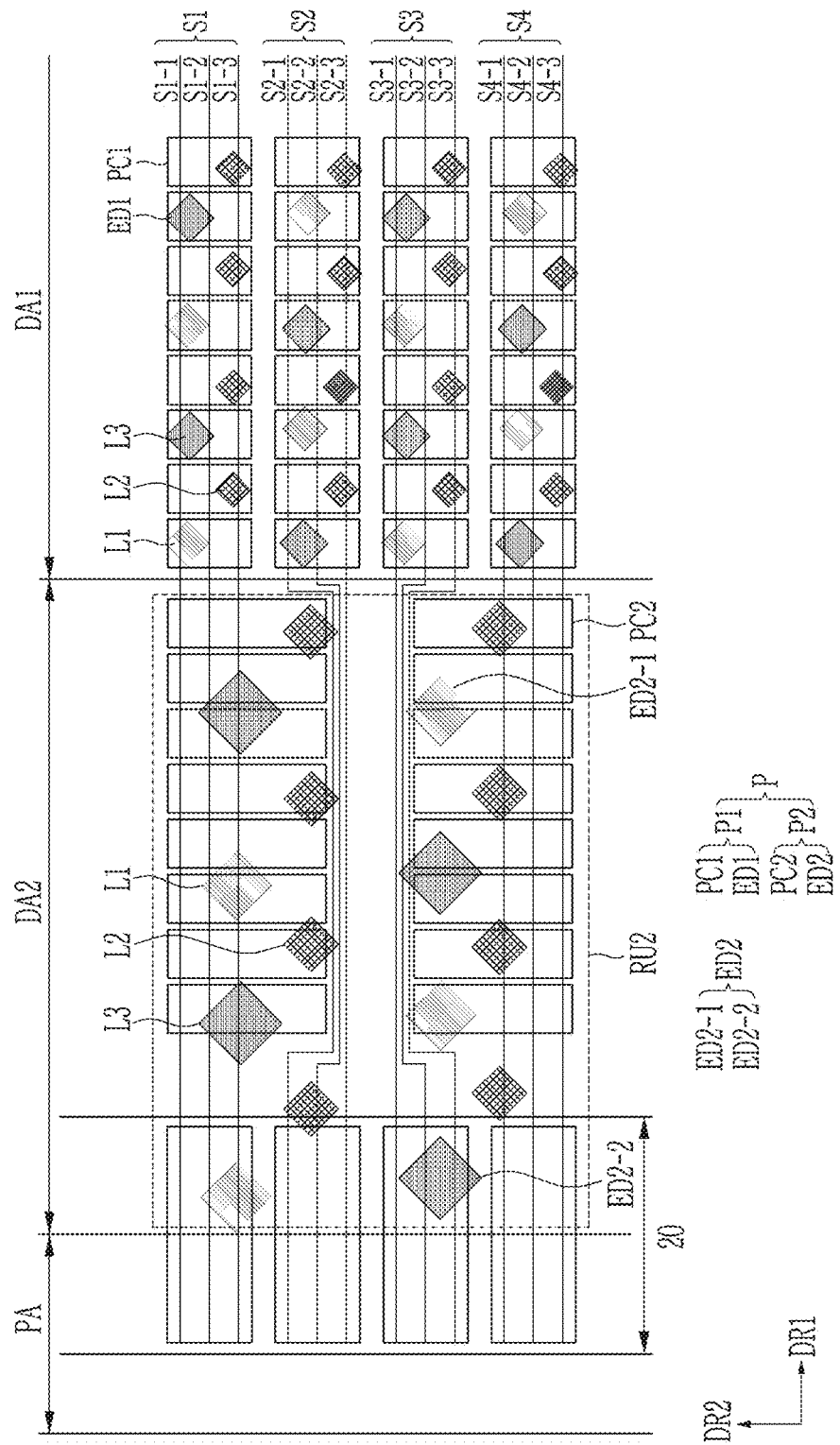
FIG. 9 illustrates a schematic top plan view of another embodiment of a connection between a driving circuit and a light emitting diode of a representative pixel.

Hereinafter, the connection between the scan lines positioned in the first display area and the second display area will be described with reference to FIG. 7 to FIG. 9. FIG. 7 illustrates a schematic top plan view of an embodiment of a connection between a driving circuit and a light emitting diode of a representative pixel, FIG. 8 illustrates a schematic diagram of light emitted from each display area of an embodiment of an extended display device constructed according to principles of the invention, and FIG. 9 illustrates a schematic top plan view of another embodiment of a connection between a driving circuit and a light emitting diode of a representative pixel.

First, referring to FIG. 7, a first pixel P1 including the first driving circuit PC1 and the first light emitting diode ED1 connected to the first driving circuit PC1 is positioned in the first display area DAL. Most of the first light emitting diode ED1 may be positioned on an area occupied by the first driving circuit PC1. In the embodiments described herein, although one light emitting element is illustrated to correspond to a shape of the light emitting layer exposed through an opening of the partition wall, the light emitting element corresponds to a configuration including a pixel electrode and a common electrode overlapping the light emitting layer.

A second pixel P2 including the second driving circuit PC2 and the second light emitting diode ED2 connected to the second driving circuit PC2 is positioned in the first display area DA2. One driving circuit PC2 and one light emitting diode ED2 may be electrically connected to each other on the right side. The driving circuit PC2 and the light emitting diode ED2 electrically connected to each other may partially overlap, or may not overlap.

In the first display area DA1, a plurality of pixels P1 positioned from a $n^{th}$ row to a (n+4)th row are illustrated. n is an integer value equal to 1 or more.

In the $n^{th}$ row, first scan line sets S1, S(1-1), S(1-2), and S(1-3) crossing the pixels P1 arranged along the first direction DR1 are positioned. The first scan line sets S1, S(1-1), S(1-2), and S(1-3) are connected to the first driving circuits PC1 positioned in the $n^{th}$ row. Although the illustrated embodiment shows one pixel P1 connected to three scan lines, the embodiments are not limited thereto, and may vary depending on a circuit configuration of one pixel.

The first scan line sets S1, S(1-1), S(1-2), and S(1-3) may be connected to the scan driver 20 across the first display area DA1 and the second display area DA2. In this case, the first scan line sets S1, S(1-1), S(1-2), and S(1-3) may be connected to the second driving circuit PC2 positioned in the second display area DA2. A second pixel P2 of the second display area DA2 connected to the first scan line sets S1, S(1-1), S(1-2), and S(1-3) may be a plurality of pixels P2 positioned in the $n^{th}$ row.

An area occupied by each of the first driving circuits PC1 and an area occupied by each of the second driving circuits PC2 may be different. An area occupied by one second driving circuit PC2 may be larger than an area occupied by one first driving circuit PC1, and for example, the area of the second driving circuit PC2 may be 1.1 to 2.0 times the area of the first driving circuit PC1.

In addition, an area occupied by the first light emitting diode ED1 and an area occupied by the second light emitting diode ED2 may be different. For example, the area of the emission layer included in the first light emitting diode ED1 and the area of the emission layer included in the second light emitting diode ED2 may be different from each other. For example, the area of the emission layer included in the second light emitting diode ED2 may be 1.1 times to 2.0 times the area of the emission layer included in the first light emitting diode ED1.

In the first display area DA1, the pixels P1 positioned in the (n+1)th row may be connected to the second scan line sets S2, S(2-1), S(2-2), and S(2-3). Specifically, the second scan line sets S2, S(2-1), S(2-2), and S(2-3) may be connected to the scan driver 20 across the first display area DA1 and the second display area DA2. The second scan line sets S2, S(2-1), S(2-2), and S(2-3) may not connected to the second driving circuit PC2, and may be connected to the scan driver 20 by bypassing the second driving circuit PC2.

In the first display area DA1, the pixels P1 positioned in the (n+2)th row may be connected to third scan line sets S3, S(3-1), S(3-2), and S(3-3). The third scan line sets S3, S(3-1), S(3-2), and S(3-3) may be connected to the scan driver 20 across the first display area DA1 and the second display area DA2. In this case, the third scan line sets S3, S(3-1), S(3-2), and S(3-3) may be connected to the second driving circuit PC2 positioned in the second display area DA2. The pixels P2 connected to the third scan line set S3, S(3-1), S(3-2), and S(3-3) may be located in the (n+1)th row in the second display area DA2.

In the first display area DA1, the pixels P1 positioned in the (n+3)th row may be connected to fourth scan line sets S4, S(4-1), S(4-2), and S(4-3). The fourth scan line sets S4, S(4-1), S(4-2), and S(4-3) may be connected to the scan driver 20 across the first display area DA1 and the second display area DA2. The fourth scan line sets S4, S(4-1), S(4-2), and S(4-3) may be connected to the scan driver 20 by bypassing the second driving circuit PC2.

With respect to the pixels P1 constituting four rows positioned in the first display area DA1, a plurality of pixels P2 constituting two rows may be positioned in the second display area DA2. According to an embodiment, the pixels P2 positioned in the second display area DA2 may be repeatedly disposed along the second direction DR2 by using the first and second scan line sets S1 and S2 positioned in the first display area DA1 as one repeating unit RU1.

According to an embodiment, the first display area DA1 and the second display area DA2 illustrated in FIG. 7 may correspond to the second portion of the second display area DA2-2 illustrated in FIG. 1.

Further, a plurality of light emitting diodes ED1 and ED2 may be arranged in a pentile-shaped matrix. The light emitting diodes ED1 and ED2 emitting a first color L1 and the light emitting diodes ED1 and ED2 emitting a third color L3 may be alternately arranged along the first direction DR1. The first light emitting diodes ED1 and ED2 emitting the first color L1 and the light emitting diodes ED1 and ED2 emitting a second color L2 may be alternately arranged along a diagonal direction that is inclined with respect to the first direction DR1 and the second direction DR2. The light emitting diodes ED1 and ED2 configured to emit the first color L1 may be larger than the light emitting elements ED1 and ED2 emitting the second color L2, and may be smaller than the light emitting diodes ED1 and ED2 configured to emit the third color L3. For example, the first color L1 may be red (R), the second color L2 may be green (G), and the third color L3 may be blue (B).

For example, for the pixels P1 and P2 positioned in the nth row of the first display area DA1 and the second display area DA2, a light emitting element representing the first color L1, a light emitting element representing the second color L2, a light emitting element representing the third color L3, and a light emitting element representing the second color L2 may be alternately positioned.

Also, for the second light emitting diodes ED2 positioned in the (n+1)th row positioned in the second display area DA2, for example, a light emitting diode representing the third color L3, a light emitting diode representing the second color L2, a light emitting diode representing the first color L1, and a light emitting diode representing the second color L2 may be alternately positioned. The third scan line set S3 connected to the second light emitting diodes ED2 positioned in the (n+1)th row in the second display area DA2 is connected to the first light emitting diodes ED1 positioned in the (n+2)th row in the first display area DA1. For the first light emitting diodes ED1 positioned in the (n+2)th row positioned in the first display area DA1, for example, a light emitting diode representing the first color L1, a light emitting diode representing the second color L2, a light emitting diode representing the third color L3, and a light emitting diode representing the second color L2 may be alternately positioned.

Arrangement of such light emitting diodes is schematically illustrated in FIG. 8. This will be described together with FIG. 7.

As illustrated in FIG. 8, the light emitting diodes ED1 positioned in the nth row in the first display area DA1 and the light emitting diodes ED2 positioned in the nth row in the second display area DA2 are connected to the same scan line S1, and arrangements of light emitted by the light emitting diodes are also the same.

In contrast, the light emitting diodes ED1 positioned in the (n+2)th row in the first display area DA1 and the light emitting diodes ED2 positioned in the (n+1)th row in the second display area DA2 are connected to the same scan line S1, but arrangements of light emitted by the light emitting diodes are different. For example, the third scan line set S3 positioned in the first display area DA1 and the light emitting diode ED1 connected to a first data line DATA1 may emit the first color L1. The third scan line set S3 positioned in the second display area DA2 and the light emitting diode ED2 connected to a second data line DATA2 may emit the third color L3.

In this case, data applied through the second data line DATA2 in the second display area DA2 and the data applied through the first data line DATA1 in the first display area DA1 need to be applied interchangeably. The IC driving chip 80 or the data driver 58 described with reference to FIG. 3 may be configured to exchange and apply data to be applied to the two data lines DATA1 and DATA2 among image data sequentially applied from the outside. That is, since image data of one frame is applied in order depending on a standard, the position of data to be applied to a specific pixel is determined. Accordingly, when positions of two pixels (or the driving circuits) to be applied by replacing each other are determined, positions of image data of one frame may be determined. Two data sets may be easily programmatically switched without any separate structural change by changing the two data sets of corresponding positions with each other. The second light emitting diodes ED2 positioned in the (n+1)th row in the second display area DA2 by applying the two switched data may sequentially emit the third color L3, the second color L2, the first color L1, and the second color L2, and the first light emitting diodes ED1 positioned in the (n+2)th row in the first display area DA1 may sequentially emit the first color L1, the second color L2, the third color L3, and the second color L2.

Next, referring to FIG. 9, in the first display area DA1, the pixels P1 positioned from the nth row to the (n+4)th row are illustrated. Herein, n is an integer value equal to 1 or more.

In the nth row, first scan line sets S1, S(1-1), S(1-2), and S(1-3) crossing the pixels P1 arranged along the first direction DR1 are positioned. The first scan line sets S1, S(1-1), S(1-2), and S(1-3) are connected to the first driving circuits PC1 positioned in the nth row.

The first scan line sets S1, S(1-1), S(1-2), and S(1-3) may be connected to the scan driver 20 across the first display area DA1 and the second display area DA2. In this case, the first scan line sets S1, S(1-1), S(1-2), and S(1-3) may be connected to the second driving circuit PC2 positioned in the second display area DA2. A second pixel P2 of the second display area DA2 connected to the first scan line sets S1, S(1-1), S(1-2), and S(1-3) may be a plurality of pixels P2 positioned in the nth row.

In the first display area DA1, the pixels P1 positioned in the (n+1)th row may be connected to the second scan line sets S2, S(2-1), S(2-2), and S(2-3). The second scan line sets S2, S(2-1), S(2-2), and S(2-3) may be connected to the scan driver 20 across the first display area DA1 and the second display area DA2. The second scan line sets S2, S(2-1), S(2-2), and S(2-3) may not connected to the second driving circuit PC2, and may be connected to the scan driver 20 by bypassing the second driving circuit PC2.

In the first display area DA1, the pixels P1 positioned in the (n+2)th row may be connected to third scan line sets S3, S(3-1), S(3-2), and S(3-3). Specifically, the third scan line sets S3, S(3-1), S(3-2), and S(3-3) may be connected to the scan driver 20 across the first display area DA1 and the second display area DA2. The third scan line sets S3, S(3-1), S(3-2), and S(3-3) may not connected to the second driving circuit PC2, and may be connected to the scan driver 20 by bypassing the second driving circuit PC2.

In the first display area DA1, the pixels P1 positioned in the (n+3)th row may be connected to fourth scan line sets S4, S(4-1), S(4-2), and S(4-3). The fourth scan line sets S4, S(4-1), S(4-2), and S(4-3) may be connected to the scan driver 20 across the first display area DA1 and the second display area DA2. In this case, the fourth scan line sets S4, S(4-1), S(4-2), and S(4-3) may be connected to the second driving circuit PC2 positioned in the second display area DA2. The pixels P2 of the second display area DA2 connected to the fourth scan line sets S4, S(4-1), S(4-2), and S(4-3) may be positioned in the (n+1)th row.

With respect to the pixels P1 constituting four rows positioned in the first display area DA1, a plurality of pixels P2 constituting two rows may be positioned in the second display area DA2. The pixels P2 positioned in the second display area DA2 may be repeatedly disposed along the second direction DR2 by using the first and fourth scan line sets S1, S2 S3, and S4 positioned in the first display area DA1 as one repeating unit RU2.

According to an embodiment, the first display area DA1 and the second display area DA2 illustrated in FIG. 9 may correspond to the first portion of the second display area DA2-1 illustrated in FIG. 1. However, the embodiments are not limited thereto, and both the first portion of the second display area DA2-1 and the second portion of the second display area DA2-2 may include the first repeating unit RU1 according to the embodiment of FIG. 7.

Figure 10:
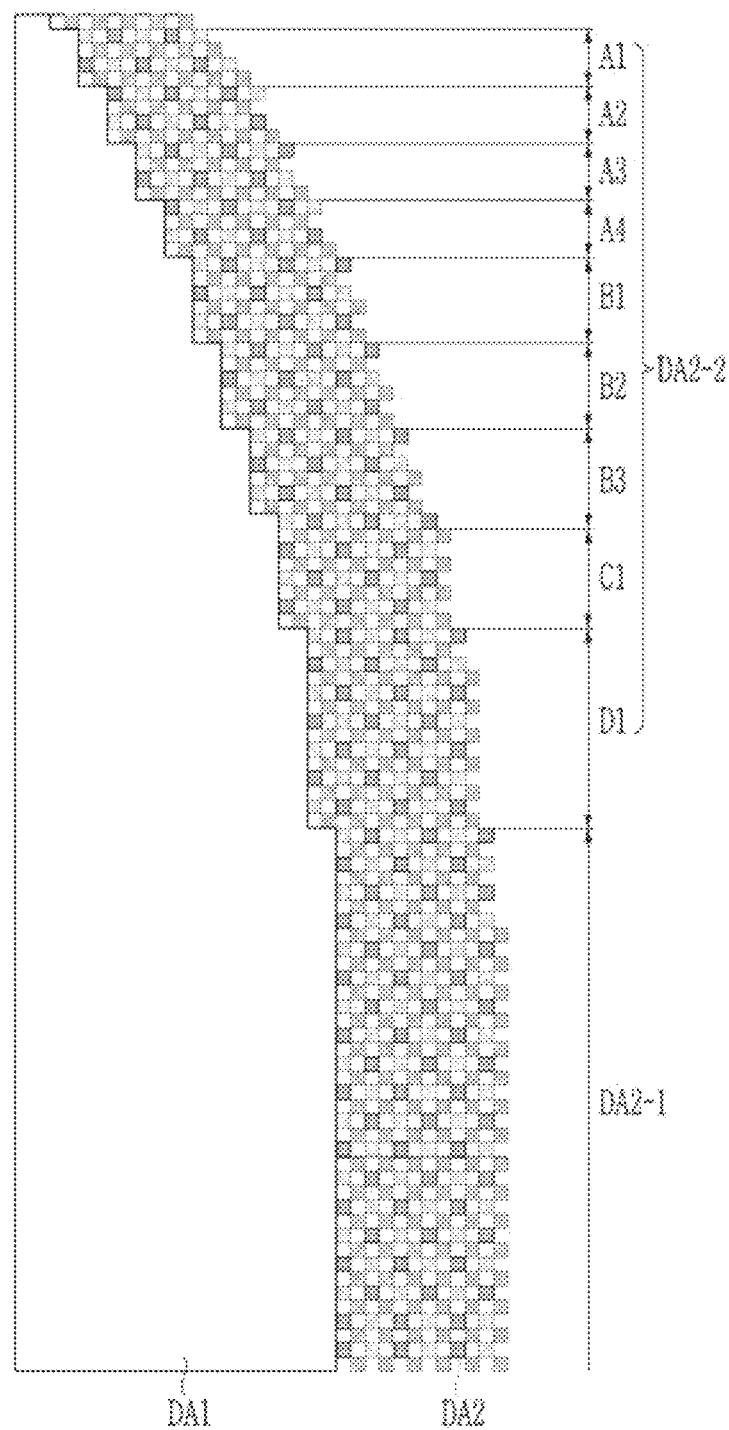
FIG. 10 illustrates a top plan view of an embodiment of a boundary between a first display area and a second display area of an extended display device constructed according to principles of the invention.

FIG. 10 illustrates a top plan view of an embodiment of a boundary between a first display area DA1 and a second display area DA2 of an extended display device constructed according to principles of the invention.

Referring to FIG. 10, the display area includes the first display area DA1 and the second display area DA2. In addition, the display area may be divided into a first portion of the second display area DA2-1 and a second portion of the second display area DA2-2 along the second direction DR2. The first portion of the second display area DA2-1 is an area in which a boundary between the first display area DA1 and the second display area DA2 is a straight line. The second portion of the second display area DA2-2 is a region in which the boundary between the first display area DA1 and the second display area DA2 has a step shape (e.g., staircase shape). The boundary between the first display area DA1 and the second display area DA2 may be visually recognized with a round shape by a user.

The first portion of the second display area DA2-1 may include the first display area DA1 and the second display area DA2 described with reference to FIG. 9. The second portion of the second display area DA2-2 may include the first display area DA1 and the second display area DA2 described with reference to FIG. 7.

According to an embodiment, the second display area DA2 described with reference to FIG. 7 may include two scan line sets positioned in the first display area DA1 along the second direction DR2 as a minimum repeating unit.

As illustrated, areas A1, A2, A3, and A4 may include a first row in which a light emitting element representing the first color L1, a light emitting element representing the second color L2, a light emitting element representing the third color L3, and a light emitting element representing the second color L2 are repeated; and a second row in which the light emitting element representing the third color L3, the light emitting element representing the second color L2, the light emitting element representing the first color L1, and the light emitting element representing the second color L2 are repeated, in a form of a pentile-shaped matrix. Each row may be one repeating unit.

Areas B1, B2, and B3 may further include a third row repeated in a same arrangement as the first row in addition to the first row and the second row included in the areas A1 to A4. An area C1 may further include a fourth row repeated in a same arrangement as the second row in the first to third rows included in the areas B1 to B3. An area D1 may further include fifth to seventh rows in addition to the first to fourth rows included in the area C1.

Compared to the areas A1 to A4, the areas B1 to B3 are regions to which one repeating unit is added. Since an area occupied by one repeating unit is small, a stepped, or a staircase shape, between the areas A1 to A4 and the areas B1 to B3 may show a very small difference, and are hardly recognized by a user. This may be the same as that of a step shape between the areas B1 to B3 and the area C1 that is barely, if at all, recognized by a user.

Figure 11:
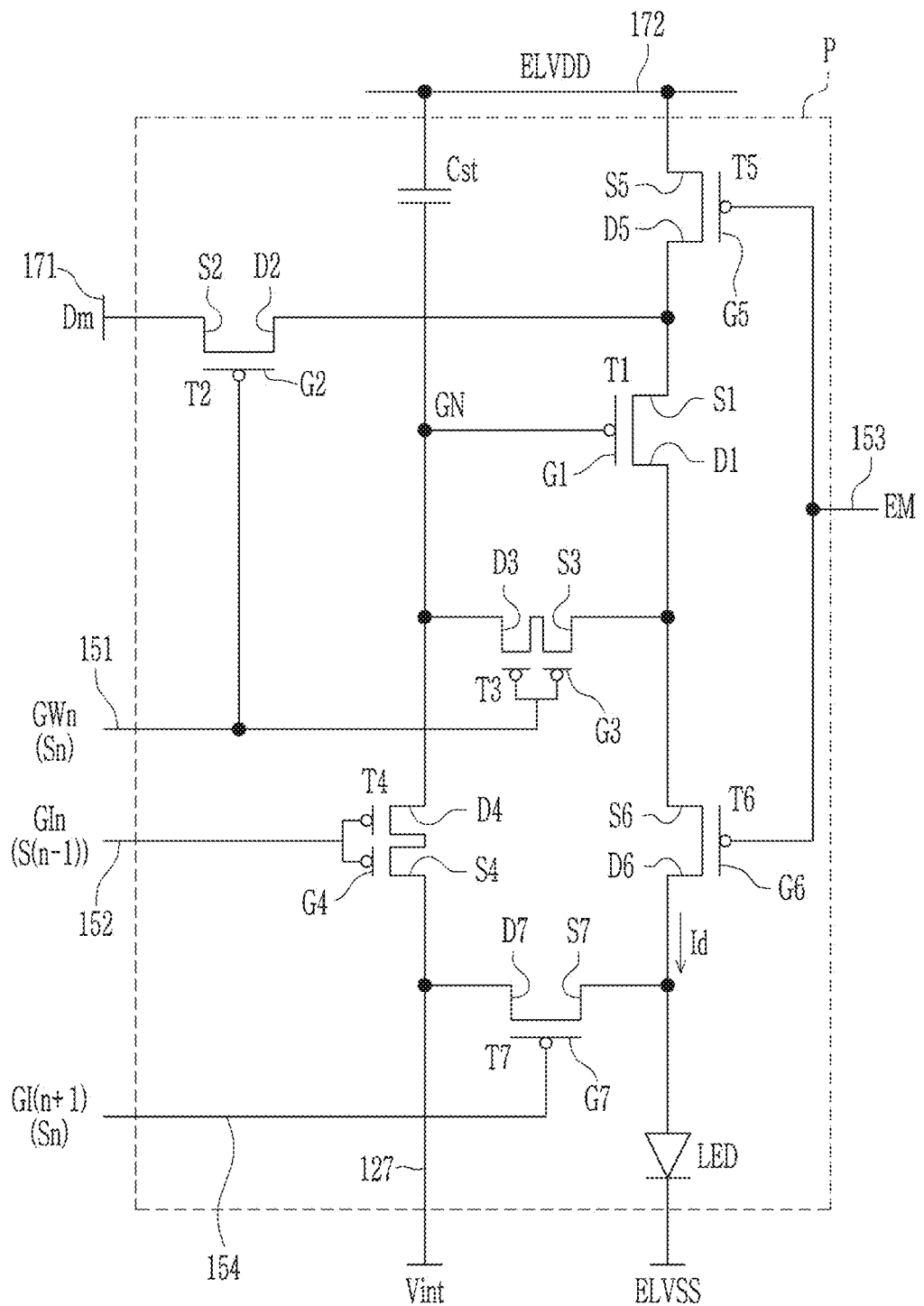
FIG. 11 illustrates an embodiment of a circuit diagram of representative pixel positioned in a first display area of an extended display device constructed according to principles of the invention.

FIG. 11 illustrates an embodiment of a circuit diagram of a representative pixel positioned in a first display area of an extended display device constructed according to principles of the invention. For reference, the representative pixel may include a driving circuit and a light emitting element connected to the driving circuit, and the driving circuit may include a plurality of transistors including an active layer and a conductor.

Referring to FIG. 11, a display device according to an embodiment includes a plurality of pixels P capable of displaying an image and a plurality of signal lines 127, 151, 152, 153, 154, 171, and 172. One representative pixel P includes transistors T1, T2, T3, T4, T5, T6, and T7, a capacitor Cst, and at least one light emitting diode LED that are connected to the signal lines 127, 151, 152, 153, 171, and 172. In the illustrated embodiment, an example in which one representative pixel P includes one light emitting diode LED will be mainly described.

The signal lines 127, 151, 152, 153, 154, 171, and 172 may include an initialization voltage line 127, a plurality of scan lines 151, 152, and 154, a control line 153, a data line 171, and a driving voltage line 172.

The initialization voltage line 127 may transfer an initialization voltage Vint. The scan lines 151, 152, and 154 may transfer scan signals GWn, GIn, and GI(n+1), respectively. The scan signals GWn, Gin, and GI(n+1) may transfer a gate-on voltage and a gate-off voltage that can turn the transistors T2, T3, T4, and T7 included in a pixel P on or off.

The scan lines 151, 152, and 154 connected to the pixel P may include a first scan line 151 through which the scan signal Gin can be transferred, a second scan line 152 through which the scan signal Gin having a gate-on voltage can be transferred at a different time from that of the first scan line 151, and a third scan line 154 through which the scan signal GI(n+1) may be transferred. The first scan line 151, the second scan line 152, and the third scan line 154 represent one scan line set described herein. In the illustrated embodiment of FIG. 11, an example in which the second scan line 152 transfers the gate-on voltage at a time that is earlier than the first scan line 151 will be mainly described. For example, when the scan signal GWn is an nth scan signal Sn (n being a natural number that is equal to or greater than 1) among the scan signals applied during one frame, the scan signal GIn may be a previous-stage scan signal such as an (n−1)th, and the scan signal GI(n+1) may be an nth scan signal Sn. However, the embodiments are not limited thereto, and the scan signal GI(n+1) may be a scan signal that is different from the nth scan signal Sn.

The control line 153 may transfer a control signal, and particularly may transfer an emission control signal EM capable of controlling light emission of a light-emitting diode LED included in the pixel P. The control signal transferred by the control line 153 may transfer the gate-on voltage and the gate-off voltage, and may have a waveform that is different from that of the scan signal transferred by the scan lines 151, 152, and 154.

The data line 171 may transfer a data signal Dm, and the driving voltage line 172 may transfer a driving voltage ELVDD. The data signal Dm may have a different voltage level depending on an image signal inputted into the display device, and the driving voltage ELVDD may have a substantially constant level.

The display device may further include, in alternative implementations, a driver that transfer signals to the signal lines 127, 151, 152, 153, 154, 171, and 172.

The transistors T1, T2, T3, T4, T5, T6 and T7 included in one representative pixel P may include a first transistor T1, a second transistor T2, a third transistor T3, a fourth transistor T4, a fifth transistor T5, a sixth transistor T6, and a seventh transistor T7.

The first scan line 151 may transfer the scan signal GWn to the second transistor T2 and the third transistor T3, the second scan line 152 may transfer the scan signal GIn to the fourth transistor T4, the third scan line 154 may transmit the scan signal GI(n+1) to the seventh transistor T7, and the control line 153 may transfer the light emission control signal EM to the fifth transistor T5 and the sixth transistor T6.

The gate electrode G1 of the first transistor T1 is connected to a first end of the capacitor Cst through a driving gate node GN, a first electrode S1 of the first transistor T1 is connected to the driving voltage line 172 via the fifth transistor T5, and a second electrode D1 of the first transistor T1 is connected to an anode of the light emitting diode LED via the sixth transistor T6. The first transistor T1 may receive a data signal Dm transferred by the data line 171 depending on a switching operation of the second transistor T2 to supply a driving current Id to the light emitting diode LED.

The gate electrode G2 of the second transistor T2 is connected to the first scan line 151, a first electrode S2 of the second transistor T2 is connected to the data line 171, and a second electrode D2 of the second transistor T2 is connected to the first electrode S1 of the first transistor T1 and is connected to the driving voltage line 172 via the fifth transistor T5. The second transistor T2 may be turned on depending on the scan signal GWn received through the first scan line 151 to transfer the data signal Dm transferred from the data line 171 to the first electrode S1 of the first transistor T1.

A gate electrode G3 of the third transistor T3 is connected to the first scan line 151, and a first electrode S3 of the third transistor T3 is connected to the second electrode D1 of the first transistor T1 and is connected to the anode of the light emitting diode ED via the sixth transistor T6. A second electrode D3 of the third transistor T3 is connected to a second electrode D4 of the fourth transistor T4, the first end of the capacitor Cst, and the gate electrode G1 of the first transistor T1. The third transistor T3 may be turned on depending on the scan signal GWn transferred through the first scan line 151 to connect the gate electrode G1 and the second electrode D1 of the first transistor T1 to each other such that the first transistor T1 can be element-connected.

The gate electrode G4 of the fourth transistor T4 is connected to the second scan line 152, a first electrode S4 of the fourth transistor T4 is connected to a terminal of an initialization voltage Vint, and a second electrode D4 of the fourth transistor T4 is connected to a first end of the capacitor Cst via the second electrode D3 of the third transistor T3 and connected to the gate electrode G1 of first transistor T1. The fourth transistor T4 is turned on by the scan signal GIn transferred through the second scan line 152 to transfer the initialization voltage Vint to the gate electrode G1 of the first transistor T1, in order to perform an initializing operation for initializing a voltage of the gate electrode G1 of the transistor T1.

The gate electrode G5 of the fifth transistor T5 is connected to the control line 153, a first electrode S5 of the fifth transistor T5 is connected to the driving voltage line 172, and a second electrode D5 of the fifth transistor T5 is connected to the first electrode S1 of the first transistor T1 and is connected to the second electrode D2 of the second transistor T2.

A gate electrode G6 of the sixth transistor T6 is connected to the control line 153, and a first electrode S6 of the sixth transistor T6 is connected to the first electrode S3 of the first transistor T1 and the first electrode S3 of the third transistor T3. A second electrode D6 of the sixth transistor T6 is electrically connected to the anode of the light-emitting diode ED. The fifth transistor T5 and the sixth transistor T6 are simultaneously turned on depending on the emission control signal EM transferred through the control line 153, thereby the driving voltage ELVDD is compensated through the diode-connected first transistor T1 to be transmitted to the light-emitting diode ED.

A gate electrode G7 of the seventh transistor T7 is connected to the third scan line 154, and a first electrode S7 of the seventh transistor T7 is connected to the second electrode D6 of the sixth transistor T6 and the anode of the light-emitting-diode ED. A second electrode D7 of the seventh transistor T7 is connected to the terminal of the initialization voltage Vint terminal and the first electrode S4 of the fourth transistor T4.

The transistors T1, T2, T3, T4, T5, T6, and T7 may be P-type channel transistors such as PMOS transistors, but the embodiments are not limited thereto, and at least one of the transistors T1, T2, T3, T4, T5, T6, and T7 may be an N-type channel transistor, or may include both a P-type channel transistor and an N-type channel transistor.

A first end of the capacitor Cst is connected to the gate electrode G1 of the first transistor T1 as described above, and a second end is connected to the driving voltage line 172. The cathode of the light emitting diode LED may be connected to a common voltage (ELVSS) terminal for transferring a common voltage ELVSS to receive the common voltage ELVSS.

The structure of the pixel P is not limited to the structure illustrated herein and the numbers of the transistors and capacitors included in one pixel P and the connections to the various circuit elements may be variously modified.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate having a first display area and a second display area;
a first circuit disposed on the substrate;
a second circuit disposed on the substrate;
a first light emitting diode electrically connected to the first circuit;
a second light emitting diode electrically connected to the second circuit; and
a scan driver disposed on the substrate, wherein
the first circuit, the second circuit, and the scan driver are disposed in that order toward an edge of the substrate,
the second light emitting diode overlaps with the second circuit and at least a portion of the scan driver,
a first scan line set disposed in a $n^{th}$ row and a second scan line set disposed in a $n+1^{th}$ row form a first repeating unit,
the second circuit is electrically connected to the one of a $n^{th}$ scan line set and a $n+2^{th}$ scan line set extending from the first circuit in the second display area, and n is a natural number, and
an area of the first circuit in the first display area is smaller than an area of the second circuit in second display area.

2. The display device of claim 1, wherein
the first light emitting diode comprises a first emitting layer, and the second light emitting diode comprises a second emitting layer, and
an area occupied by the first emitting layer is smaller than an area occupied by the second emitting layer.

3. The display device of claim 1, wherein the first circuit and the first light emitting diode are disposed on the first display area.

4. The display device of claim 1, wherein the second circuit and the second light emitting diode are disposed on the second display area.

5. The display device of claim 1, wherein the second light emitting diode overlaps at least a portion of the second circuit.

6. The display device of claim 1, wherein the scan driver overlaps with a part of the second light emitting diode.

7. The display device of claim 1, wherein the scan driver overlaps with a part of the second display area.

8. The display device of claim 1, wherein the first scan line set disposed in the $n^{th}$ row crosses the first display area.

9. The display device of claim 1, wherein the first scan line set disposed in the $n^{th}$ row crosses the second display area.

10. The display device of claim 1, wherein the second scan line set disposed in the $n+1^{th}$ row crosses the first display area.

11. The display device of claim 1, wherein the second scan line set disposed in the $n+1^{th}$ row crosses the second display area.

12. The display device of claim 1, wherein the second scan line set disposed in the $n+1^{th}$ row is spaced apart from the second circuit.

13. The display device of claim 2, wherein the second scan line set disposed in the $n+1^{th}$ row is spaced apart from the second emitting layer.

14. The display device of claim 1, wherein the first scan line set disposed in the $n^{th}$ row and the second scan line set disposed in the $n+1^{th}$ row are extended along a row direction.

15. The display device of claim 1, wherein the first scan line set disposed in the $n^{th}$ row and the second scan line set disposed in the $n+1^{th}$ row are alternately disposed along a column direction.

16. The display device of claim 1, wherein the first scan line set disposed in the $n^{th}$ row and the second scan line set disposed in the $n+1^{th}$ row are electrically connected to the scan driver.

17. The display device of claim 1, wherein a red pixel, a green pixel, a blue pixel and a green pixel area repeatedly disposed in a first row of the first display area.

18. The display device of claim 1, wherein a red pixel, a green pixel, a blue pixel and a green pixel are repeatedly disposed in a first row of the second display area.

19. A display device comprising:
a substrate having a first display area and a second display area;
a first circuit disposed on the substrate;
a second circuit disposed on the substrate;
a first light emitting diode electrically connected to the first circuit;
a second light emitting diode electrically connected to the second circuit; and
a scan driver disposed on the substrate, wherein
the first circuit, the second circuit, and the scan driver are disposed in that order toward an edge of the substrate,
the second light emitting diode overlaps with the second circuit and at least a portion of the scan driver,
a first scan line set disposed in a $n^{th}$ row, a second scan line set disposed in a $n+1^{th}$ row, a third scan line set disposed in a $n+2^{th}$ row, and a fourth scan line set disposed in a $n+3^{th}$ row form a second repeating unit, and n is a natural number,
the second circuit is electrically connected to one of the first scan line set and the third scan line set extending from the first circuit in the second display area,
an area of the first light emitting diode in the first display area is smaller than an area of the second light emitting diode in second display area.

20. The display device of claim 19, wherein
the first light emitting diode comprises a first emitting layer, and the second light emitting diode comprises a second emitting layer, and
an area occupied by the first emitting layer is smaller than an area occupied by the second emitting layer.

21. The display device of claim 19, wherein the first circuit and the first light emitting diode are disposed on the first display area.

22. The display device of claim 19, wherein the second circuit and the second light emitting diode are disposed on the second display area.

23. The display device of claim 19, wherein the second light emitting diode overlaps at least a portion of the second circuit.

24. The display device of claim 19, wherein the scan driver overlaps a part of the second light emitting diode.

25. The display device of claim 19, wherein the scan driver overlaps with a part of the second display area.

26. The display device of claim 19, wherein the first scan line set disposed in the nth row crosses the first display area and the second display area.

27. The display device of claim 19, wherein the second scan line set disposed in the n+1$^{th}$ row crosses the first display area and the second display area.

28. The display device of claim 19, wherein the second scan line set disposed in the n+1$^{th}$ row is spaced apart from the second circuit.

29. The display device of claim 19, wherein the first scan line set disposed in the n$^{th}$ row and the second scan line set disposed in the n+1$^{th}$ row are extended along a row direction.

30. The display device of claim 19, wherein the first scan line set disposed in the n$^{th}$ row and the second scan line set disposed in the n+1$^{th}$ row are alternately disposed along a column direction.

31. The display device of claim 19, wherein the first scan line set disposed in the n$^{th}$ row and the second scan line set disposed in the n+1$^{th}$ row are electrically connected to the scan driver.

32. The display device of claim 19, wherein a red pixel, a green pixel, a blue pixel and a green pixel area repeatedly disposed in a first row of the first display area.

33. The display device of claim 19, wherein a red pixel, a green pixel, a blue pixel and a green pixel are repeatedly disposed in a first row of the second display area.

* * * * *